United States Patent [19]

Ban et al.

[11] Patent Number: 5,299,218
[45] Date of Patent: Mar. 29, 1994

[54] MULTI-TIP SEMICONDUCTOR LASER

[75] Inventors: Yuzaburo Ban, Osaka; Touru Saitoh, Tsukuba; Tadasi Narusawa; Kiyoshi Ohnaka, both of Osaka, all of Japan

[73] Assignee: Matsushita Electric Industrial Co., Ltd., Osaka, Japan

[21] Appl. No.: 914,078

[22] Filed: Jul. 16, 1992

[30] Foreign Application Priority Data

Jul. 18, 1991 [JP] Japan ................... 3-178082

[51] Int. Cl.$^5$ ............................................. H01S 3/19
[52] U.S. Cl. ............................ 372/45; 372/44; 372/50; 257/79; 257/88; 257/89
[58] Field of Search ............. 372/43, 44, 45, 50; 257/79, 88, 89

[56] References Cited

U.S. PATENT DOCUMENTS 5,119,386 6/1992 Narusawa ..................... 372/45

FOREIGN PATENT DOCUMENTS 2-188980 7/1990 Japan .

Primary Examiner—Georgia Y. Epps
Attorney, Agent, or Firm—Lowe, Price, LeBlanc & Becker

[57] ABSTRACT

A multi-tip semiconductor laser comprises: a substrate; a cladding layer; an active layer formed of alkali-halide crystal on the cladding layer; at least a field emission tip formed on a surface of the substrate to have a substantially corn shape, the field emission tip being so arranged to confront the active layer; a vacuum space structure for providing a space between substrate and the cladding layer with the field emission tip confronting the active layer and for maintaining the space in a vacuum state; and an electrode structure for a producing electrostatic field between the field emission tip and the same in response to an external voltage supply such that the field emission tip emits an electron beam toward the active layer. The active layer may be doped and be made of organic crystal. It may further comprises a conducting layer covering at least a portion of said active layer. The active layer may be formed in a channel formed in the anode layer. The active layer may be formed in a capillary buried in a channel formed in the anode layer. This multi-tip semiconductor laser emits blue laser light.

21 Claims, 3 Drawing Sheets

MULTI-TIP SEMICONDUCTOR LASER

BACKGROUND OF THE INVENTION

1. Field of the Invention

This invention relates to a multi-tip semiconductor laser and particularly relates to a multi-tip semiconductor laser for emitting a visible light.

2. Description of the Prior Art

A multi-tip semiconductor laser for emitting a short wavelength laser light is known which comprises an active layer and a cathode layer having a multi-tip field emission array, the cathode layer being so arranged that multi-tip field emission array confronts the active layer. The active layer is excited to emit laser light by electron beams radiated from respective tips of the multi-tip filed emission array by electrostatic fields applied therebetween. Such semiconductor laser is disclosed in Japanese patent application provisional publication No. 2-188980. FIG. 5 is a cross-sectional view of this prior art multi-tip semiconductor laser.

In FIG. 5, numeral 101 is a GaAs substrate, numeral 102 is a ZnS clad layer, numeral 103 is a Zn S active layer, numeral 104 is $SiO_2$ film, numeral 105 is $SiO_2$ film, numeral 106 is a field emission tip, numeral 107 is a Si substrate, numeral 108 is a vacuum space, and numeral 109 is a Mo electrode film.

In the prior art multi-tip semiconductor laser, the active layer 103 comprises II-VI group compound semiconductor and it emits a blue laser light by a slab type light waveguide structure.

However, there is a problem that oscillation wavelength is limited by use of II-VI group compound semiconductor for the active layer, that is, it cannot provide a laser light of other wavelength. Further, there is a problem that it is difficult for this slab type light waveguide structure to provide only single transverse mode oscillation.

SUMMARY OF THE INVENTION

The present invention has been developed in order to remove the above-described drawbacks inherent to the conventional multi-tip semiconductor laser.

According to the present invention there is provided a multi-tip semiconductor laser comprising: a substrate; a cladding layer; an active layer formed of alkali-halide crystal on the cladding layer; at least a field emission tip formed on a surface of the substrate to have a substantially corn shape, the field emission tip being so arranged to confront the active layer; a vacuum space structure for providing a space between substrate and the cladding layer with the field emission tip confronting the active layer and for maintaining the space in a vacuum state; and an electrode structure for a producing electrostatic field between the field emission tip and the same in response to an external voltage supply such that the field emission tip emits an electron beam toward the active layer.

According to the present invention there is also provided a multi-tip semiconductor laser comprising: a substrate; an optical cavity having a light waveguide structure including: a cladding layer having a channel extending over one surface thereof; and an active layer formed in the channel, the active layer having a higher refractive index than the cladding layer; at least a field emission tip formed on a surface of the substrate to have a substantially corn shape, the field emission tip being so arranged to confront the active layer; a vacuum space structure for providing a space between substrate and the cladding layer with the field emission tip confronting the active layer and for maintaining the spaces in a vacuum state; and an electrode structure for a producing electrostatic field between the field emission tip and the same in response to an external voltage supply such that the field emission tip emits an electron beam toward the active layer.

According to the present invention there is further provided a multi-tip semiconductor laser comprising: a substrate; a cladding layer having a channel in one surface thereof; an optical cavity having a light waveguide structure including: a capillary buried in the channel; and an active layer formed in the capillary, the active layer having a higher refraction index than the capillary and the cladding layer; at least a field emission tip formed on a surface of the substrate to have a substantially corn shape, the field emission tip being so arranged to confront the active layer; a vacuum space structure for providing a space between substrate and the cladding layer with the field emission tip confronting the active layer and for maintaining the space in a vacuum state; and an electrode structure for producing electrostatic field between the field emission tip and the same in response to an external voltage supply such that the field emission tip emits an electron beam toward the active layer.

BRIEF DESCRIPTION OF THE DRAWINGS

The object and features of the present invention will become more readily apparent from the following detailed description taken in conjunction with the accompanying drawings in which.

The same or corresponding elements or parts are designated as like reference throughout the drawings.

DETAILED DESCRIPTION OF THE INVENTION

Figure 1:
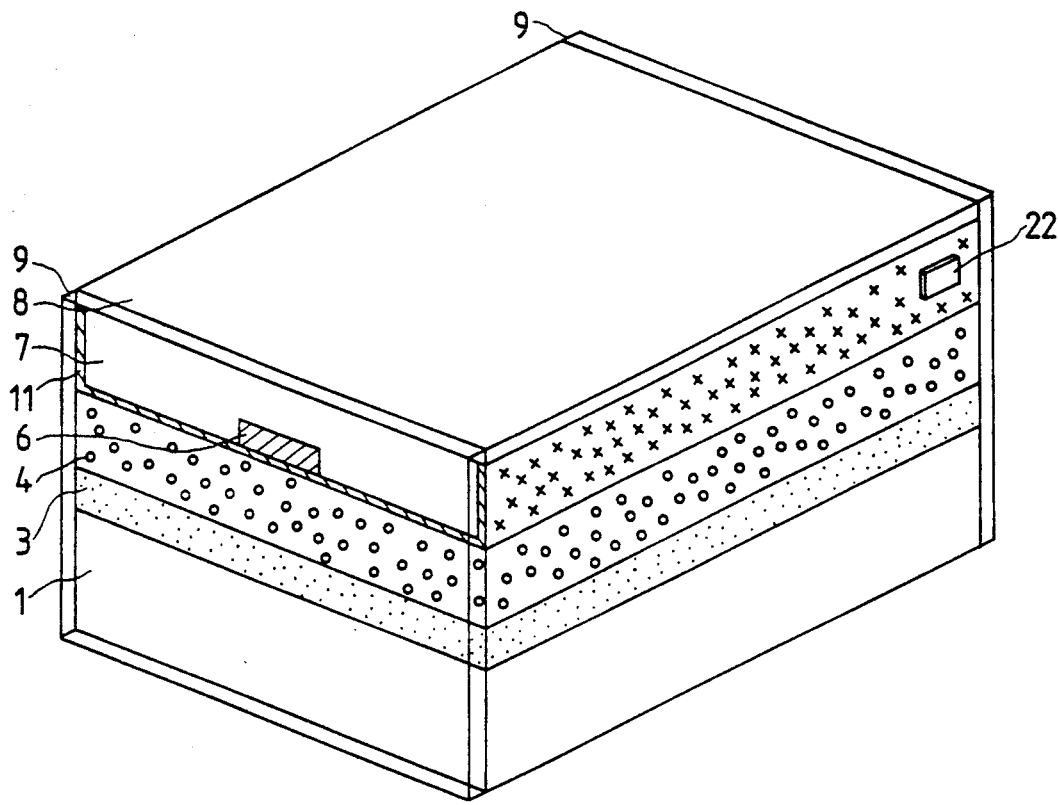
FIG. 1 is a perspective view of a multi-tip semiconductor laser of the first embodiment.
Figure 2:
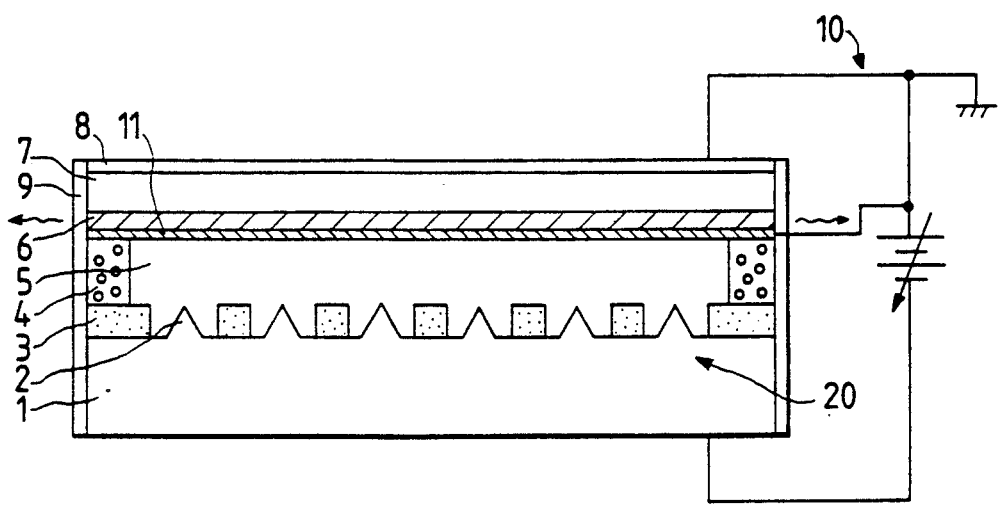
FIG. 2 is a cross-sectional view of the first embodiment.

Hereinbelow will be described a first embodiment of this invention. FIG. 1 is a perspective view of a multi-tip semiconductor laser of the first embodiment. FIG. 2 is a cross-sectional view of the first embodiment. Numeral 1 is a conductive substrate made of a metal, Si, or the like. Numeral 2 denotes a field emission tip. Numerals 3 and 4 are insulation layers made of $SiO_2$ or the like. A total thickness of the insulation layers 3 and 4 is about 10 μm. Numeral 5 denotes a vacuum space. Numeral 6 denotes an active layer made of NaI:Tl crystal. Numeral 7 is a quartz plate used as a cladding layer. Numeral 8 is an electrode made of Au or the like. Numeral 9 is a passivation film made of $Al_2O_3$, $SiO_2$, or the like. Numeral 10 is an electrostatic field application apparatus for producing an electrostatic field of hundreds KeV. Numeral 11 is an Al film covering one of surfaces of the active layer 6. A plurality of field emission tips are arranged on the substrate 1 to form a field emission tip array 20 which confronts the active layer 6.

Hereinbelow will be described a production method of the multi-tip semiconductor laser briefly.

At first, the field emission tip array 20 are formed on the conductive substrate 1 by aisotropic etching of Si crystal of the conductive substrate 1, depositing Mo films in a corn shape on the conductive substrate 1, discharge processing, or the like. Each of the field emission tips having a diameter of about several μm at its bottom. The field emission tips 2 are arranged in parallel to the active layer 6 and are so arranged to confront the active layer with a constant density per unit area in order that the active layer 6 is irradiated by electron beams uniformly to be excited uniformly. On the other hand, the quartz plate 7 is processed separately from the field emission tips 2. The quartz plate 7 has a channel of several μm width and several μm depth formed therein at its surface. An NaI:Tl crystal is grown in the channel in the quartz plate 7 as the active layer 6 by Bridgeman method or the like. That is, NaI is crystal-grown in the channel with Tl doped. This structure can be obtained by other means. For example, a thru-hole having several μm square is formed in the quartz plate. Then, NaI:Tl crystal is grown in the hole. Cutting the quarts plate having NaI:Tl crystal to expose a surface of the NaI:Tl crystal also provides this structure.

Then, the Al film 11 is formed on the active layer 6 and the quartz-plate 7 to have a thickness of hundreds to thousands angstroms by vacuum deposition of Al, side surfaces of the quarts plate 7 being covered with Al film 11 also in order to form an electrode 22. Then, the conductive substrate 1 and the quartz plate 7 are combined together with the insulation layer 4 sandwiched therebetween in a vacuum by soldering with In or the like such that the field emission tips 2 formed on the conductive palate 1 confront the active layer 6 formed in the quartz plate 7. Then, the passivation films 9 is formed by deposition of $Al_2O_3$ by spattering or the like on the both surfaces of the combined body where both ends of the active layer 6 are exposed respectively. Both ends of the active layer 6 are formed to have cleavage planes, and both ends of the quartz plate 7 are formed to have mirror surface. The active layer 6 has a higher refractive index than the quartz plate 7, so that the active layer 6 has a light waveguide structure. These cleavage planes of the active layer 6 and the light waveguide structure provide an optical cavity. At last, the electrode 8 made of Au is formed on the exposed surface of the quartz plate 7 and the electrode 22 on the Al film 11.

As described, the active layer 6 is made of NaI:Tl as the alkali-halide crystal doped. However, an alkali-halide crystal without dope, that is, for example, NaI, can be also used for the active layer 6. Moreover, an organic crystal such as anthracene crystal mentioned in the second embodiment can be used as the active layer 6.

Hereinbelow will be described operation of the first embodiment.

The multi-tip semiconductor laser produced as mentioned above emits blue laser light by application of a voltage from several volts to hundreds volts between the conductive substrate 1 and the quartz plate 7. The smaller the radius of curvature of the each of the tips the larger the electrostatic field intensity at each of the field emission tips. Thus, such sharp tips causes field emission of electrons. The emitted electrons run through the vacuum space 5 with acceleration and reach a surface of the Al film 11. The electrons transmit the Al film 11 because their energy are several electron-volts to hundreds electron-volts. The transmitted electrons excite electrons in a valence band of NaI of the NaI:Tl crystal to a conduction band. The electrons excited to the conduction band recombine with holes through the luminescent center formed by Tl of the NaI:Tl crystal with emission of blue light having an wavelength of 420 nm. Therefore, the optical cavity including the active layer 6 formed in the quartz plate 7 and passivation films 9 emits a blue light laser of 420 nm.

Operation of this embodiment will be described more specifically. The active layer 6 is irradiated by electron beams emitted from the multi-tip array 20 by electrostatic field between multi-tip array 20 and the electrode 8 or the Al film 11, so that excitons are produced in the active layer 6. In the case that the alkali-halide crystal without dope is used for the active layer 6, the excitons are formed, namely, the electron excited are restrained by Vk center (two combined halide atoms $I_2$) in the active layer 6. This turns the excitons to self-trapped excitons (STE). Then, the blue light laser is produced by recombination of electron and holes of the self trapped excitons together. The wavelength of this semiconductor laser depends on kind of the alkali-halide crystal. For example, in NaF crystal 500 nm range is obtained, in KBr crystal 500 nm range, and RbI crystal, 400 nm range.

In the case that NaI:Tl crystal, that is, NaI doped with Tl, LiI:Eu crystal, CsI:Tl crystal, or the like is used for the active layer 6, the excited electrons and holes generated by irradiation of electron beams recombine through luminescent center. NaI:Tl crystal emits laser light of wavelength of about 420 nm; LiI:Eu crystal emits laser light of wavelength of about 470 nm, and CsI:Tl crystal emits laser light of wavelength of about 470 nm.

In the case that the anthracene crystal, trans-stilbene-crystal, or the like is used for the active layer 6, the excited electrons and holes generated by irradiation of electron beams recombine through luminescent centers (excitons).

In this embodiment, a portion of the active layer 6 is covered with the Al film 11 along the longitutional direction of the active layer 6. This prevents charge-up of the excited electrons which is caused by that the NaI:Tl crystal 6 is an insulator. That is, connection of the Al film 11 to the Au electrode 8 through the electrode 22 formed on an exposed surface of the Al film 11 allows electrons injected into the NaI:Tl crystal 6 for exciting to continuously escape to the ground through the Al film 11 and the Au electrode 8, so that the injected electrons do not accumulate in the NaI:Tl crystal 6. Therefore, this Al film 11 prevents decrease in voltage difference between the NaI:Tl crystal 6 and the field emission tips with charge-up which decrease will cause reduction of the output of light in the absence of the Al film 11. In this embodiment, the Al film 11 is formed on the surface of the active layer 6 which confronts the field emission tip array 20. However, the Al film 11 can be provided to other surface of the active layer 6. The reason why the Al film 11 is formed on this surface is for only easiness of production processing.

In this embodiment, NaI:Tl crystal is used for the active layer 6 as mentioned above. However, this invention is applicable to a semiconductor light emitting device having an active layer including another alkali-halide crystal and another impurity forming the luminescent center. Further, in the case of use of a LiI:Eu crystal for the active layer emits light having oscillation wavelength of 470 nm. Use of a CsI:Tl crystal for the active layer provides a light having oscillation wavelength from 420 to 570 nm. That is, they features the production of laser light of blue to green region. Moreover, in this embodiment, the doped alkali-halide crystal is used, that is, the active layer 6 is formed by crystal growth of NaI with Tl doped. However, only alkali-halide crystal without dope can be also used for the active layer 6.

Figure 3:
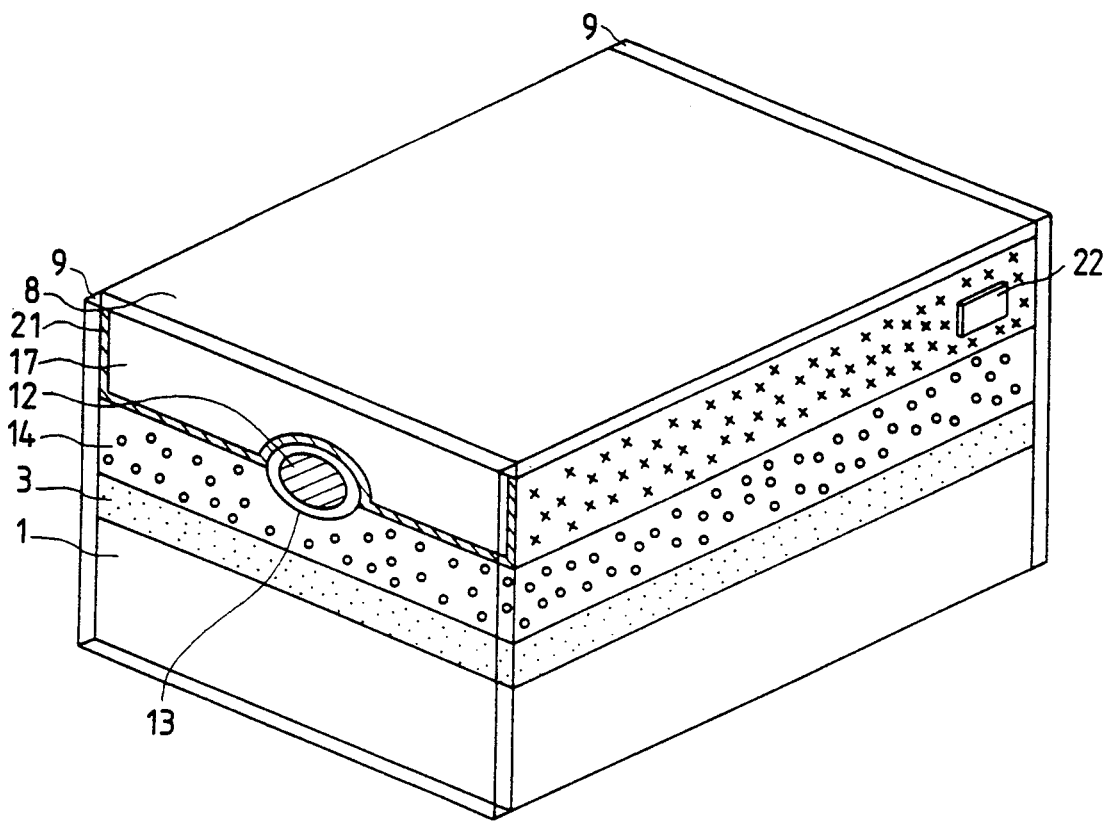
FIG. 3 is a perspective view of the multi-tip semiconductor laser of the second embodiment.

Hereinbelow will be described a second embodiment of multi-tip semiconductor laser with reference to FIG. 3. FIG. 3 is a perspective view of the multi-tip semiconductor laser of the second embodiment. Basic structure of this embodiment is essentially the same as that of the first embodiment. There is a difference in the structure of this embodiment from the first embodiment such that the active layer 12 is formed to have a fiber-shape whose cross section is essentially a circle. This fiber-shape provide a light waveguide structure because the active layer 12 has a higher refraction index than the capillary 13.

Hereinbelow will be described a production method of the second embodiment of the multi-tip semiconductor laser.

The conductive substrate 1 is processed in the same manner as the first embodiment to have the field emission tip array 20. Similarly, the quartz plate 17 corresponding to the quartz plate 7 of the first embodiment is processed separately from the conductive substrate 1, wherein the quartz plate 17 is used as a clodding layer. The quartz plate 17 has a channel whose cross section is a substantial semicircle having a diameter of hundreds μm. Also, an insulation layer 14 corresponding to the insulation layer 4 of the first embodiment is formed to have channels to sandwich the active layer 12 together with the quartz plate 17 at the both ends. Therefore, cross section of each of channels is a substantial semicircle having a diameter of several μm to hundreds μm. The quartz plate 17 is covered with an Al film 21 corresponding to the Al film 11 of the first embodiment, the Al film 21 being formed by vacuum deposition of Al to have a thickness of hundreds to thousands angstroms.

In fact, the active layer 12 is formed by crystal growth of anthracene in a capillary 13 made of glass or quartz by Bridgeman method. The outside diameter of the capillary 13 is hundreds μm because it should fit to the channels of the quartz plate 17 and the insulation layer 14. Its inside diameter is tens μm.

Then, the conductive substrate 1 and the quartz plate 17 are combined together with the insulation layer 14 sandwiched therebetween in a vacuum by soldering with In or the like such that the field emission tips 2 formed on the conductive plate 1 confront the active layer 12 formed in the quartz plate 17. Then, the passivation films 9 is formed by deposition of Al₂O₃ by spattering or the like on the both surfaces of the combined body where both ends of the active layer 12 are exposed respectively. Both ends of the active layer 12 and the capillary 13 are formed to have mirror surface planes. The active layer 12 has a higher refractive index than the capillary 13, so that the active layer 12 has a light waveguide structure. These cleavage planes of the active layer 12 and the light waveguide structure provide an optical cavity. At last, the electrode 8 made of Au is formed on the exposed surface of the quartz plate 17 and the electrode 22 on the Al film 11.

The multi-tip semiconductor laser is driven in the same manner as the first embodiment. This laser emits a laser light having an wavelength of about 420 nm if anthracene is used for the active layer 12.

As described, anthracene or trans-stilbene is used for the active layer 12 as the organic crystal. However, the alkali-halide crystal NaI or the like or the alkali-halide crystal with dope NaI;Tl or the like can be also used for the active layer 12.

In this embodiment, a portion of the capillary 13 is covered with the Al film 21 along the longitudinal direction of the active layer 6. This prevents charge-up of the excited electrons which is caused by that the active layer 13 is an insulator. That is, connection of the Al film 11 to the Au electrode 8 through the electrode 22 formed on an exposed surface of the Al film 21 allows electrons injected into the active layer 12 for exciting to continuously escape to the ground through the Al film 21 and the Au electrode 8, so that the injected electrons do not accumulate in the active layer 12. Therefore, this Al film 21 prevents decrease in voltage difference between the active layer 12 and the field emission tips 2 with charge-up which decrease will cause reduction of the output of light in the absence of the Al film 21. In this embodiment, the Al film 21 is provided between the surface of the active layer 12 and the quartz plate 17. However, the Al film 21 can be provided to other surface of the active layer 12. The reason why the Al film 21 is provided this position is for only easiness of production processing.

In this embodiment, there is an advantage effect that the cross section of the cylindrical active layer 12 is determined by that of the capillary 13, so that a far field pattern of emitted laser light from this semiconductor laser is approximately a circle, that is, the aspect ratio of this far field pattern is about one, which is useful. Further, the aspect ratio can be changed in accordance with application of this multi-tip semiconductor laser easily.

As mentioned, in the second embodiment, an organic crystal is used as the active layer 12. In the case that anthracene crystal is used as an organic crystal for the active layer 12, an wavelength of laser light is about 440 nm; in the case of trans-stilbene crystal, 410 nm. Therefore, these semiconductor laser emit laser light of blue region. Moreover, as the active layer 12, alkali-halide crystal or alkali-halide crystal doped can be used.

Figure 4:
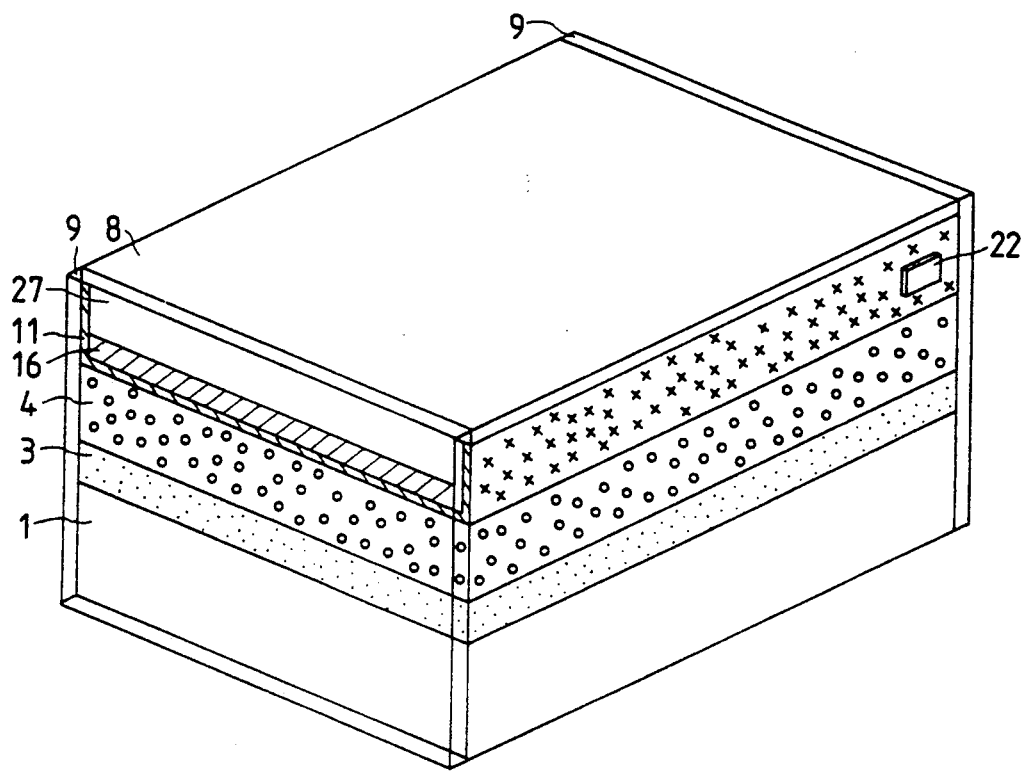
FIG. 4 is a perspective view of a modified embodiment.
Figure 5:
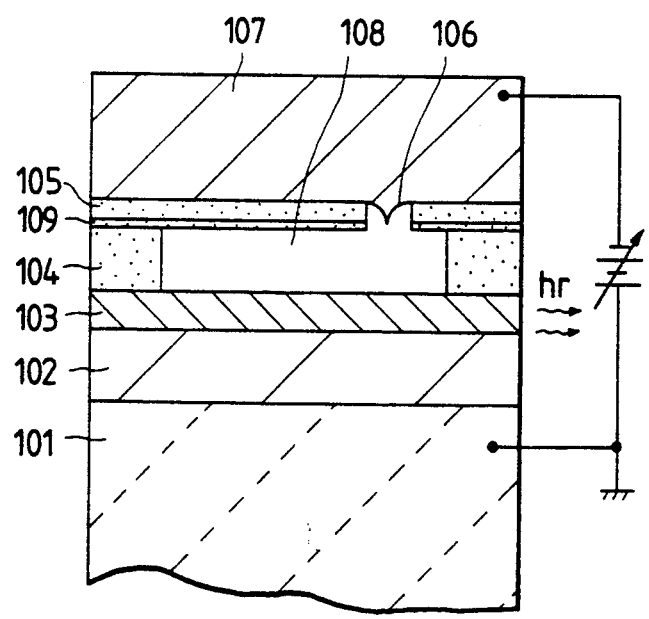
FIG. 5 is a cross-sectional view of a prior art multi-tip semiconductor laser.

The first and second embodiment have a light waveguide structure around the active layer. However, an active layer made of alkali-halide crystal, alkali-halide crystal doped, or an organic crystal having no light waveguide structure with a multi-tip structure provides the blue laser light also. FIG. 4 is a perspective view of a such modified embodiment. In FIG. 4, the active layer 16 is formed on the quartz plate 27 which is used as a cladding layer. The active layer 16 is formed of alkali-halide crystal, alkali-halide crystal doped, or organic crystal. Other structure is the same as the first embodiment. Thus, the detailed description is omitted.

In the first and second embodiments, the electrode is formed on the Al film 11. However, the Al film 11 formed to be connected to the electrode 8 eliminates this electrode 22.

As mentioned above, in the first and second embodiments, various wavelengths of blue laser light are obtained by use of alkali-halide crystal, doped alkali-halide crystal, or the organic crystal with multi-tip structure. In the second embodiment, a desired aspect ratio of far field pattern can be obtained in the blue light semiconductor laser.

What is claimed is:

1. A multi-tip semiconductor laser comprising:
   (a) a substrate;
   (b) a cladding layer;
   (c) an active layer formed of alkali-halide crystal on said cladding layer;
   (d) at least a field emission tip formed on a surface of said substrate to have a substantially corn shape, said field emission tip being so arranged to confront said active layer;
   (e) vacuum space means for providing a space between substrate and said cladding layer with said field emission tip confronting said active layer and for maintaining said space in a vacuum state; and
   (f) electrode means for producing an electrostatic field between said field emission tip and the same in response to an external voltage supply such that said field emission tip emits an electron beam toward said active layer.

2. A multi-tip type semiconductor laser as claimed in claim 1, wherein said alkali-halide crystal is doped.

3. A multi-tip type semiconductor laser as claimed in claim 1, wherein said electrode means comprises a conducting layer covering at least a portion of said active layer, said conducting layer extending along said active layer.

4. A multi-tip type semiconductor laser as claimed in claim 1, wherein said electrode means comprises an electrode layer formed on said cladding layer.

5. A multi-tip type semiconductor laser as claimed in claim 1, wherein said electrode means comprises an electrode layer formed on said cladding layer and a conducting layer covering at least a portion of said active layer, said conducting layer extending along said active layer.

6. A multi-tip semiconductor laser comprising:
   (a) a substrate;
   (b) a cladding layer;
   (c) an active layer formed of organic crystal on said cladding layer;
   (d) at least a field emission tip formed on a surface of said substrate to have a substantially corn shape, said field emission tip being so arranged to confront said active layer;
   (e) vacuum space means for providing a space between substrate and said cladding layer with said field emission tip confronting said active layer and for maintaining said space in a vacuum state; and
   (f) electrode means for producing an electrostatic field between said field emission tip and the same in response to an external voltage supply such that said field emission tip emits an electron beam toward said active layer.

7. A multi-tip type semiconductor laser as claimed in claim 6, wherein said electrode means comprises an electrode layer formed on said cladding layer and a conducting layer covering at least a portion of said active layer, said conducting layer extending along said active layer.

8. A multi-tip semiconductor laser comprising:
   (a) a substrate;
   (b) an optical cavity having a light waveguide structure including: a cladding layer having a channel extending over one surface thereof; and an active layer formed in said channel, said active layer having a higher refractive index than said cladding layer;
   (c) at least a field emission tip formed on a surface of said substrate to have a substantially corn shape, said field emission tip being so arranged to confront said active layer;
   (d) vacuum space means for providing a space between substrate and said cladding layer with said field emission tip confronting said active layer and for maintaining said space in a vacuum state; and
   (e) electrode means for producing an electrostatic field between said field emission tip and the same in response to an external voltage supply such that said field emission tip emits an electron beam toward said active layer.

9. A multi-tip type semiconductor laser as claimed in claim 8, wherein said active layer is formed of alkali-halide crystal.

10. A multi-tip type semiconductor laser as claimed in claim 8, wherein said active layer is formed of alkali-halide crystal with doped.

11. A multi-tip type semiconductor laser as claimed in claim 8, wherein said active layer is formed of organic crystal.

12. A multi-tip type semiconductor laser as claimed in claim 8, wherein said electrode means comprises a conducting layer covering at least a portion of said active layer, said conducting layer extending along said active layer.

13. A multi-tip type semiconductor laser as claimed in claim 8, wherein said electrode means comprises an electrode layer formed on said cladding layer.

14. A multi-tip type semiconductor laser as claimed in claim 8, wherein said electrode means comprises an electrode layer formed on said cladding layer and a conducting layer covering at least a portion of said active layer, said conducting layer extending along said active layer.

15. A multi-tip semiconductor laser comprising:
   (a) a substrate;
   (b) a cladding layer having a channel in one surface thereof;
   (c) an optical cavity having a light waveguide structure including: a capillary buried in said channel; and an active layer formed in said capillary, said active layer having a higher refraction index than said capillary;
   (d) at least a field emission tip formed on a surface of said substrate to have a substantially corn shape, said field emission tip being so arranged to confront said active layer;
   (e) vacuum space means for providing a space between substrate and said cladding layer with said field emission tip confronting said active layer and for maintaining said space in a vacuum state; and
   (f) electrode means for producing an electrostatic field between said field emission tip and the same in response to an external voltage supply such that said field emission tip emits an electron beam toward said active layer.

16. A multi-tip type semiconductor laser as claimed in claim 15, wherein said active layer is formed of alkali-halide crystal.

17. A multi-tip type semiconductor laser as claimed in claim 15, wherein said active layer is formed of alkali-halide crystal with doped.

18. A multi-tip type semiconductor laser as claimed in claim 15, wherein said active layer is formed of organic crystal.

19. A multi-tip type semiconductor laser as claimed in claim 15, wherein said electrode means comprises a conducting layer covering at least a portion of said active layer, said conducting layer extending along said active layer.

20. A multi-tip type semiconductor laser as claimed in claim 15, wherein said electrode means comprises an electrode layer formed on said cladding layer.

21. A multi-tip type semiconductor laser as claimed in claim 15, wherein said electrode means comprises an electrode layer formed on said cladding layer and a conducting layer covering at least a portion of said active layer, said conducting layer extending along said active layer.

* * * * *

UNITED STATES PATENT AND TRADEMARK OFFICE
CERTIFICATE OF CORRECTION

PATENT NO. : 5,299,218
DATED : March 29, 1994
INVENTOR(S) : Yuzaburo BAN et al

It is certified that error appears in the above-indentified patent and that said Letters Patent is hereby corrected as shown below:

On the title page, please delete item [75] and insert the following therefor:

--[75] Inventors: Yuzaburo Ban, Osaka; Touru Saitoh, Tsukuba; Tadashi Narusawa; Kiyoshi Ohnaka, both of Osaka, all of Japan.--

Signed and Sealed this

Thirteenth Day of September, 1994

Attest:

BRUCE LEHMAN

Attesting Officer

Commissioner of Patents and Trademarks